(12) United States Patent
Tarighat Mehrabani et al.

(10) Patent No.: US 9,041,444 B1
(45) Date of Patent: May 26, 2015

(54) TIME-TO-DIGITAL CONVERTOR-ASSISTED PHASE-LOCKED LOOP SPUR MITIGATION

(71) Applicant: Broadcom Corporation, Irvine, CA (US)

(72) Inventors: Alireza Tarighat Mehrabani, Irvine, CA (US); Behzad Nourani, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 14/109,498

(22) Filed: Dec. 17, 2013

Related U.S. Application Data

(60) Provisional application No. 61/909,985, filed on Nov. 27, 2013.

(51) Int. Cl.
*H03L 7/06* (2006.01)
*H03L 7/00* (2006.01)

(52) U.S. Cl.
CPC .................................. *H03L 7/00* (2013.01)

(58) Field of Classification Search
None
See application file for complete search history.

(56) References Cited

U.S. PATENT DOCUMENTS

| | | | | |
|---|---|---|---|---|
| 7,636,020 | B1* | 12/2009 | Hwang | 331/16 |
| 8,884,672 | B2* | 11/2014 | Ballantyne et al. | 327/157 |
| 2008/0136540 | A1* | 6/2008 | Li | 331/1 A |
| 2008/0164917 | A1* | 7/2008 | Floyd et al. | 327/117 |
| 2009/0243675 | A1* | 10/2009 | Feng | 327/157 |
| 2014/0184281 | A1* | 7/2014 | Danny et al. | 327/115 |

OTHER PUBLICATIONS

"Fractional/Integer-N PLL Basics", Texas Instruments, edited by Curtis Barrett, retrieved from <http://www.ti.com/lit/an/swra029/swra029.pdf>, Technical Brief SWRA029, Aug. 1999, 55 pages.
"Basics of Dual Fractional-N Synthesizers/PLLs", Skyworks Solutions, Inc., white paper, retrieved from <http://www.digikey.com/Web%20Export/Supplier%20Content/SkyworksSolutions_863/PDF/Skyworks_WP_101463B.pdf>, May 17, 2005, 13 pages.

* cited by examiner

*Primary Examiner* — Lincoln Donovan
*Assistant Examiner* — Khareem E Almo
(74) *Attorney, Agent, or Firm* — Fiala & Weaver P.L.L.C.

(57) ABSTRACT

Methods, systems, and apparatuses are described for compensating for an undesired fractional spur due to a PLL in a communication system. The communication system includes a time-to-digital converter (TDC) that is configured to execute in parallel to the PLL. The TDC is configured to determine a phase difference between a reference frequency and an output oscillation signal provided by the PLL. The phase difference is received by a processor to estimate particular characteristics of the undesired fractional spur, and the estimate of the characteristics is used to construct an estimate of the undesired fractional spur.

20 Claims, 8 Drawing Sheets

TIME-TO-DIGITAL CONVERTOR-ASSISTED PHASE-LOCKED LOOP SPUR MITIGATION

CROSS REFERENCE TO RELATED APPLICATION

This application claims priority to U.S. Provisional Application Ser. No. 61/909,985, filed Nov. 27, 2013, the entirety of which is incorporated by reference herein.

BACKGROUND

1. Technical Field

The subject matter described herein relates to communication systems, and in particular, to techniques for mitigating spurs.

2. Background Art

A fractional phase-locked loop (PLL) is used in many wireless solutions and is present to generate all of the channelization transmit/receive frequencies with sufficient granularity per various standards. Typically, a fractional PLL is configured to multiply a reference frequency by a factor of (N+f), where N is an integer number, and f is a fractional ratio (i.e., 0<f<1). With sufficient resolution in factor f, any arbitrary frequency can be generated. Unfortunately, fractional PLL implementations suffer from the presence of a relatively strong fractional spur at distance D of the nominal tone frequency, where D is equal to f multiplied by the reference frequency.

This fractional spur may be created by several different mechanisms such as non-linear coupling of the Nth harmonic in the reference frequency and the output frequency of the clock signal provided by the fractional PLL, delta-sigma quantization noise, coupling/leakage, etc. Many of these spur sources are becoming exceedingly difficult or inefficient to mitigate in the analog domain given the tighter requirements of the latest protocols used in communication systems. Some analog-domain mitigation techniques require better isolations of particular circuitry of the fractional PLL (e.g., the voltage control oscillator), thereby requiring a larger area for implementation. Other analog-domain mitigation techniques require a large amount of current or higher supply voltages.

Accordingly, even with the deployment of known analog-domain optimization/mitigation methods, meeting the stringent spur-level requirements for next generation communication systems is proving to be unreliable and inefficient.

BRIEF SUMMARY

Methods, systems, and apparatuses are described for mitigating an undesired fractional spur in a signal due to a fractional PLL, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Introduction

Figure 1:
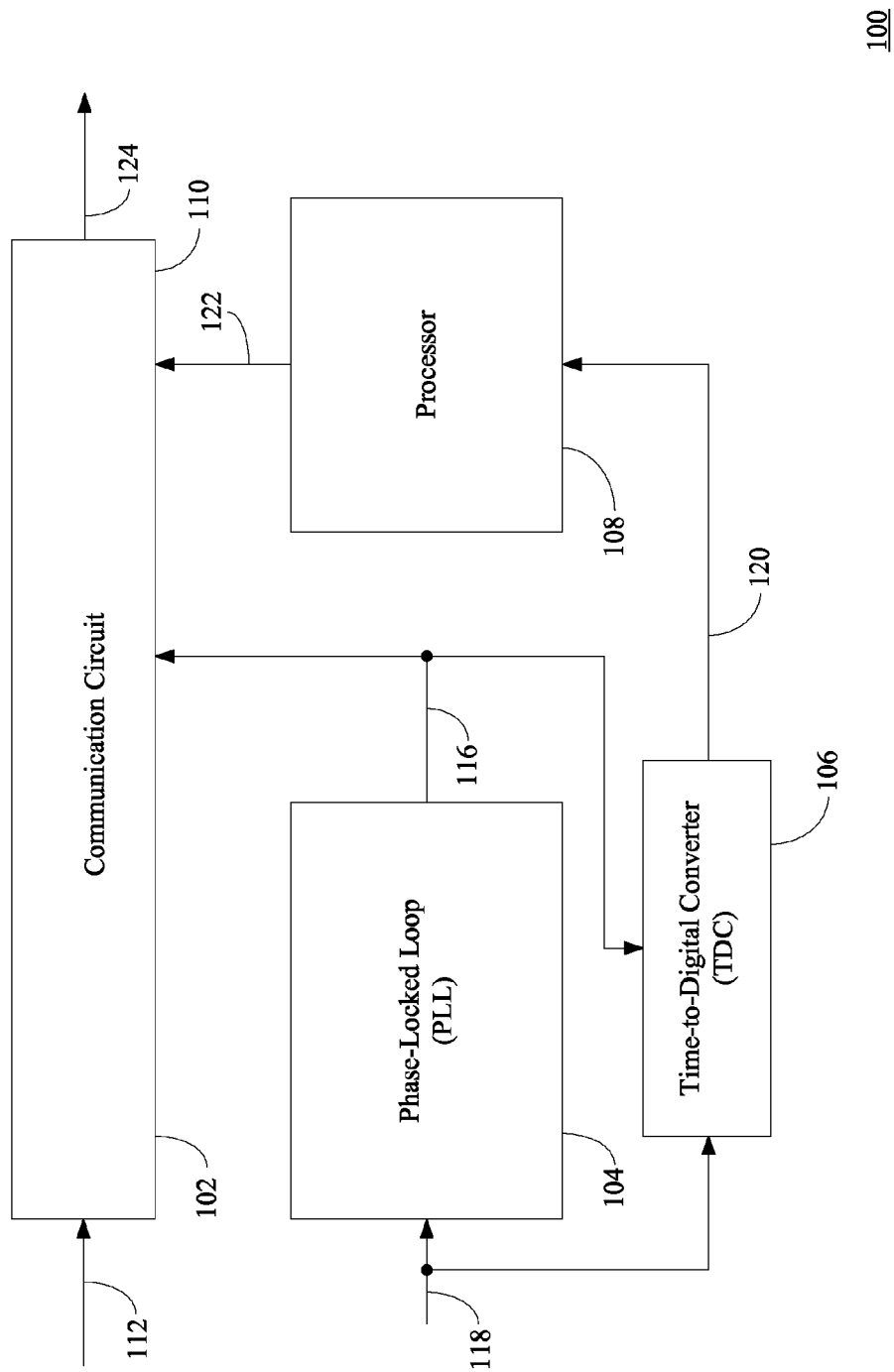
FIG. 1 depicts a block diagram of a communication system configured to mitigate undesired fractional spurs in a communication signal, according to an example embodiment.

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Numerous exemplary embodiments are described as follows. It is noted that any section/subsection headings provided herein are not intended to be limiting. Embodiments are described throughout this document, and any type of embodiment may be included under any section/subsection. Furthermore, disclosed embodiments may be combined with each other in any manner In embodiments, a communication system is described herein that is configured to compensate for an undesired fractional spur due to a PLL (phased lock loop). The communication system includes a time-to-digital converter (TDC) that is configured to execute in parallel to the PLL. The TDC is configured to determine a phase difference between a reference frequency and an output oscillation signal provided by the PLL. The phase difference is provided to a processor to estimate particular characteristics of the undesired fractional spur, and the estimate of the characteristics is used to construct an estimate of the undesired fractional spur.

In particular, a circuit that compensates for an undesired fractional spur in a baseband signal due to a fractional PLL is described herein. The fractional PLL receives a reference frequency and generates an output oscillating signal that includes an output frequency and the undesired fractional spur. The output oscillating signal is used to convert a first signal to the baseband signal. The circuit includes a TDC and a digital signal processor (DSP). The TDC is configured to determine a phase difference between the reference frequency and the output oscillating signal. The DSP is configured to estimate an amplitude and a phase of the undesired fractional spur based on the determined phase difference, and to construct an estimate of the fractional spur. The constructed estimate of the fractional spur is applied to the baseband signal to cancel the fractional spur and generate a compensated baseband signal.

Methods are also described herein for compensating for an undesired fractional spur in a baseband signal due to a fractional PLL, where the fractional PLL receives a reference frequency and generates an output oscillating signal that includes an output frequency and the undesired fractional spur, and where the output oscillating signal is used to convert a first signal to the baseband signal. In accordance with an example method, a phase difference between the reference frequency and the output oscillating signal is determined. An amplitude and a phase of the undesired fractional spur is estimated based on the determined phase difference. An estimate of the fractional spur is constructed based on the estimated amplitude and phase of the undesired fractional spur. The constructed estimate of the fractional spur is applied to the baseband signal to cancel the fractional spur and generate a compensated baseband signal.

Furthermore, a circuit that compensates for an undesired fractional spur in a first signal due to a fractional PLL is described herein. The fractional PLL receives a reference frequency and generates an output oscillating signal that includes an output frequency and the undesired fractional spur. The output oscillating signal is used to convert a baseband signal to the first signal. The circuit includes a TDC and a digital signal processor (DSP). The TDC is configured to determine a phase difference between the reference frequency and the output oscillating signal. The DSP is configured to estimate an amplitude and a phase of the undesired fractional spur based on the determined phase difference, and to construct an estimate of the fractional spur. The constructed estimate of the fractional spur is applied to the baseband signal to cancel the fractional spur and generate a compensated first signal.

Methods are also described herein for compensating for an undesired fractional spur in a baseband signal due to a fractional PLL, where the fractional PLL receives a reference frequency and generates an output oscillating signal that includes an output frequency and the undesired fractional spur, and where the output oscillating signal is used to convert a first signal to the baseband signal. In accordance with an example method, a phase difference between the reference frequency and the output oscillating signal is determined. An amplitude and a phase of the undesired fractional spur is estimated based on the determined phase difference. An estimate of the fractional spur is constructed based on the estimated amplitude and phase of the undesired fractional spur. The constructed estimate of the fractional spur is applied to the baseband signal to cancel the fractional spur and generate a compensated baseband signal.

Example Communication Circuit Including a Time-to-Digital Converter (TDC)-Assisted Phase-Locked Loop (PLL)

FIG. 1 depicts a high-level block diagram of a communication system 100 including a communication circuit 102, a phase-locked loop (PLL) 104, a TDC 106, and a processor 108, according to an embodiment. Communication system 100 is described as follows.

Communication circuit 102 may be configured as a receiver, transmitter or a transceiver for high data rate wireless applications based on one or more wireless communication standards, such as, but not limited to, Long Term Evolution (LTE), Multiple-Input Multiple Output (MIMO) LTE, LTE Advanced, High Speed Packet Access (HSPA), Evolved HSPA (HSPA+), 802.11ac/ad, etc. Communication circuit 102 may be configured to receive a first signal 112, process first signal 112, and/or convert first signal 112 into a second signal 124. Communication circuit 102 may be further configured to receive an output oscillating signal 116 from PLL 104. Output oscillating 116 may be a clock signal, which is used by communication circuit 102 to receive, process, and/or convert first signal 112 to second signal 124.

In accordance with an embodiment where communication circuit 102 is a receiver, first signal 112 may be an analog wireless signal (e.g., a radio frequency (RF) signal) transmitted by and received from a remote device (not shown). In accordance with such an embodiment, first signal 112 may be processed and converted to a digital baseband signal (e.g., second signal 124). In accordance with an embodiment where communication circuit 112 is a transmitter, first signal 112 may be a digital baseband signal that is processed and converted to an analog wireless signal (e.g., second signal 124) that is transmitted to and received by a remote device (not shown).

Communication circuit 102 may comprise one more amplifiers, mixers, integrated circuits, discrete components (e.g., resistors, capacitors, inductors, etc.), etc. When present, each of the integrated circuit(s) may be configured to operate in either or both of the analog or digital domain.

PLL 104 may be configured to generate and provide output oscillating signal 116 to communication circuit 102 and TDC 106. The output frequency of output oscillating signal 116 may be based on a reference frequency 118, which may be a reference clock received by PLL 104. In accordance with one embodiment, the output frequency of output oscillating signal 116 has a higher frequency than reference frequency 118. Reference frequency 118 may be provided by a crystal oscillator circuit (not shown).

In accordance with an embodiment, PLL 104 is a fractional PLL, which generates an output frequency and enables a frequency resolution of the output frequency that is a fractional portion of reference frequency 118. The output frequency of output oscillating signal 116 may be defined in accordance with Equation 1:

$$F_{VCO} = (N+f) \times F_{REF}, \quad \text{Equation 1}$$

where
$F_{VCO}$=the output frequency of output oscillating signal 116,
$F_{REF}$=reference frequency 118,
N=an integer number, and
f=a fractional ratio, (i.e., 0<f<1).

With sufficient resolution in factor f, any arbitrary output frequency can be generated for output oscillating signal 116.

As described above, fractional PLLs suffer from the presence of a relatively strong spur at a particular distance D from the nominal tone frequency, where D is defined in accordance with Equation 2:

$$D = f \times F_{REF}, \qquad \text{Equation 2}$$

This fractional spur may be created by several different mechanisms such as non-linear coupling of the Nth harmonic in $F_{REF}$ and $F_{VCO}$, delta-sigma quantization noise, coupling/leakage, etc.

TDC 106 and processor 108 may be configured to assist in mitigation of the presence of such a fractional spur. For example, TDC 106 may be configured to sample the instantaneous phase difference between reference frequency 118 and output oscillating signal 116 at a given sampling period. The determined phase difference may be provided by processor 108 as a digitized, quantized sequence 120. Digitized, quantized sequence 120 may be a representation of the final phase of output oscillating signal 116 (i.e., the target output frequency of output oscillating signal 116 that is achieved when PLL 104 has achieved phase/frequency lock).

Processor 108 may be configured to estimate an amplitude and a phase of the undesired fractional spur based on digitized, quantized sequence 120 and construct an estimate 122 of the fractional spur that is based at least in part on the estimated amplitude and phase of the undesired fractional spur. Estimate 122 is provided to communication circuit 102. In accordance with an embodiment, processor 108 is a digital signal processor (DSP).

Communication circuit 102 may be configured to mitigate the presence of a fractional spur based on estimate 122. For example, in accordance with an embodiment where communication circuit 102 is configured as a receiver, communication circuit 102 may include combination logic (not shown) that is configured to combine the digital baseband signal with estimate 122 to provide a clean (i.e., spur-free) second signal 124.

In accordance with an embodiment where communication circuit 102 is configured as a transmitter, communication circuit 102 may include combination logic (not shown) that is configured to combine first signal 112 with estimate 122. In accordance with such an embodiment, first signal 112 may be pre-compensated (e.g., pre-distorted) with the fractional spur represented by estimate 122. As will be described below, the fractional spur may be removed during the processing of the pre-compensated first signal by communication circuit 102, thereby resulting in a clean second signal 124. Alternatively, first signal 112 may be combined with estimate 122 after the fractional spur has been introduced (post-processing).

Example Receiver Including a Time-to-Digital Converter (TDC)-Assisted Phase-Locked Loop (PLL)

Figure 2:
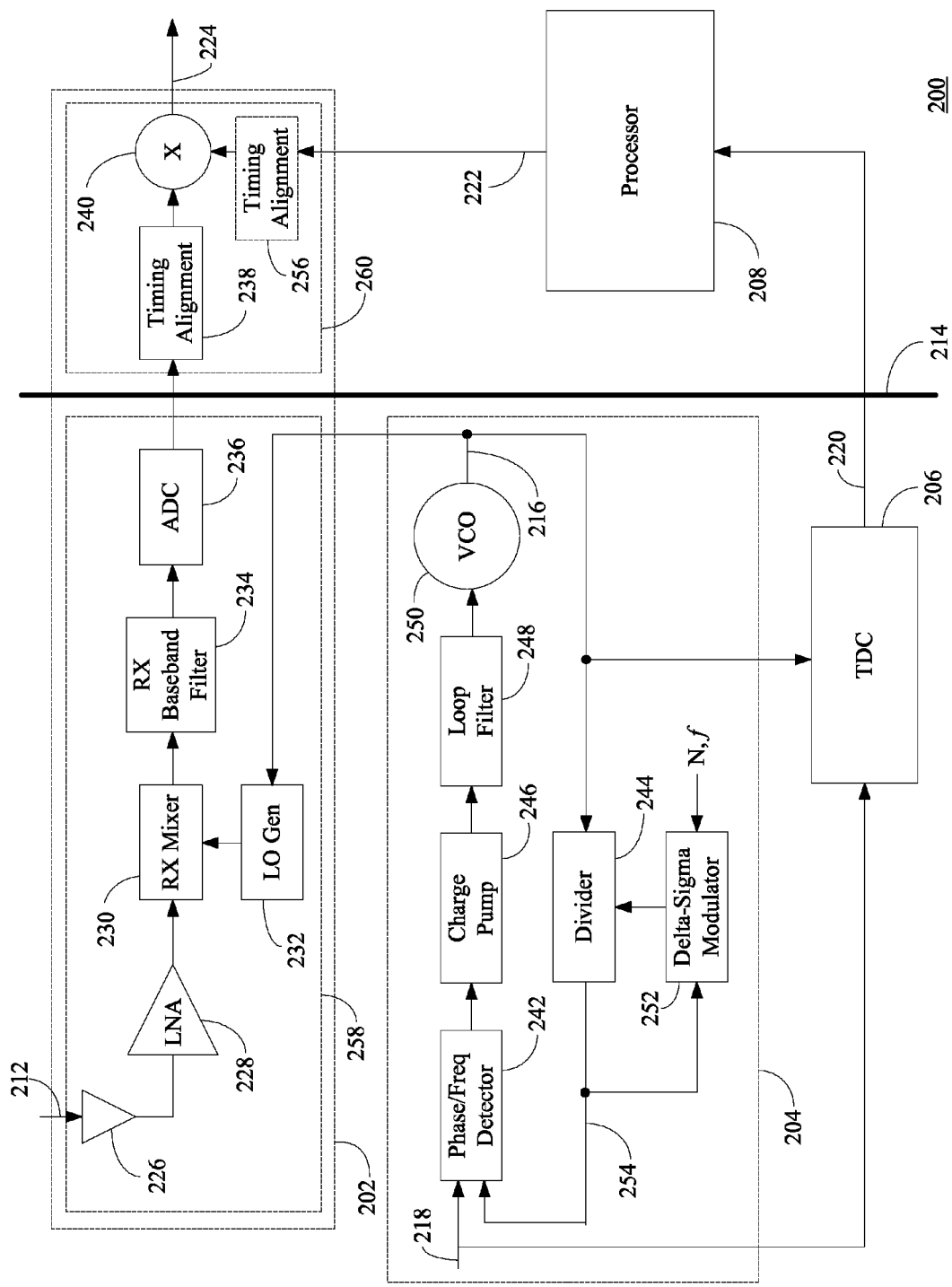
FIG. 2 depicts a block diagram showing an example configuration of the communication system of FIG. 1, according to an embodiment.

Communication system of FIG. 1 may be implemented in various ways, in embodiments. For instance, FIG. 2 depicts a block diagram of a communication system 200, according to an embodiment. Communication system 200 is an example of communication system 100. As shown in FIG. 2, communication system 200 includes a communication circuit 202, a PLL 204, a TDC 206, and a processor 208. Communication circuit 202 is an example of communication circuit 102, PLL 204 is an example of PLL 104, TDC 206 is an example of TDC 106, and processor 208 is an example of processor 108, as respectively shown in FIG. 1. In the embodiment depicted in FIG. 2, communication circuit 202 is configured as a receiver.

Particular components of communication system 200 may be configured to operate in the analog domain, and other components of communication system 200 may be configured to operate in the digital domain. For example, in on embodiment, components to the left of line 214 may be configured to operate in the analog domain, whereas components to the right of line 214 may be configured to operate in the digital domain. In other embodiments, other combinations of components may be digital or analog.

Communication circuit 202 may include one or more integrated circuits. For example, in accordance with an embodiment, communication circuit 202 includes a radio frequency (RF) integrated circuit 258 and a baseband integrated circuit 260. RF integrated circuit 258 may be configured to convert an analog RF signal 212 into a digital baseband signal. Analog RF signal 212 is an example of first signal 112, as shown in FIG. 1. RF integrated circuit 258 may include one or more antennas 226, a low noise amplifier (LNA) 228, a receive (RX) mixer 230, a local oscillator clock generator (LO gen) 232, an RX baseband filter 234, and an analog-to-digital convertor (ADC) 236.

Antenna(s) 226 may be configured to receive analog RF signal 212. LNA 228 may be configured to receive, amplify, and suppress low noise from analog RF signal 212. The amplified, low-noise signal is received by RX mixer 230, which may be configured to combine an LO frequency received from LO gen 232 and the amplified low-noise signal to down-convert the amplified, low-noise signal. The LO frequency received from LO gen 232 may be generated based on output oscillating signal 216 received from PLL 204. The down-converted signal is received by RX baseband filter 234, which may be configured to band-pass filter a desired signal from the down-converted signal to generate an analog baseband signal. The analog baseband signal is received by ADC 236, which may be configured to convert the analog baseband signal to a digital signal. The digital signal is received by baseband integrated circuit 260.

As will be described below, baseband integrated circuit 260 may be configured to compensate for one or more undesired fractional spurs from the digital signal received from RF integrated circuit 258. The fractional spur(s) may originate from PLL 204 and may be introduced into the digital signal as a result of the down-converting process performed by RX mixer 230. For example, the fractional spur(s) may be included in output oscillating signal 216 provided by PLL 204. The fractional spur(s) are passed to the LO frequency generated by LO gen 232, and then from the LO frequency to the analog RF signal 212 during the down-converting process performed by RX mixer 230. Additional details regarding PLL 204 and the fractional spur(s) generated by PLL 204 are descried below.

In accordance with an embodiment, PLL 204 is a fractional PLL that includes a phase/frequency detector 242, a charge pump 246, a loop filter 248, a voltage controlled oscillator (VCO) 250, a divider 244, and a delta-sigma modulator 252. PLL 204 may be configured to generate output oscillation signal 216, which, when phase/frequency lock is achieved, has a frequency of $(N+f) \times F_{REF}$, as described above with reference to Equation 1.

Phase/frequency detector 242 may be configured to receive reference frequency 218. Reference frequency 218 is an example of reference frequency 118 shown in FIG. 1 and may be provided by a crystal oscillator circuit or other oscillating signal source (not shown). Phase/frequency detector 242 may be further configured to receive a divided clock signal 254 provided by divider 244. Phase/frequency detector 242 may be configured to compare the phase and/or frequency of reference frequency 218 to the phase and/or frequency of divided clock signal 254. Based on the comparison, phase/frequency detector 242 provides one or more control signals to charge pump 246.

In accordance with an embodiment, control signal(s) include an UP control signal and/or a DOWN control signal. In accordance with such an embodiment, phase/frequency detector 242 determines whether divided clock signal 254 lags or leads reference frequency 218. In response to a determination that divided clock signal 254 lags reference frequency 218, phase/frequency detector 242 may provide an UP control signal. In response to a determination that divided clock signal 254 leads reference frequency 218, phase/frequency detector 242 may provide a DOWN control signal.

Charge pump 246 may be configured to convert the UP control signal into a positive current pulse and convert the DOWN control signal to a negative current pulse. These pulses are received by loop filter 248. Loop filter 248 may be configured to convert the received current pulse to a control voltage that is received by VCO 250. In accordance with an embodiment, loop filter 248 is a low pass filter that integrates the received current pulse to an equivalent control voltage.

VCO 250 may be an electronic oscillator that provides an output oscillating signal 216, which has an output frequency that is higher than the frequency of reference frequency 218. The output frequency of output oscillating signal 216 may be controlled based on the control voltage received from loop filter 248. For example, a control voltage generated as a result from phase/frequency detector 242 providing a UP control signal may cause VCO 250 to increase the output frequency of output oscillating signal 216. A control voltage generated as a result from phase/frequency detector 242 providing the DOWN control signal may cause VCO 250 to decrease the output frequency of output oscillating signal 216.

Divider 244 may be configured to receive output oscillating signal 216 and divide output oscillating signal 216 to generate divided clock signal 254. Output oscillating signal 216 may be divided in accordance with a division ratio. In accordance with an embodiment, divider 244 is a multi-modulus divider that divides output oscillating signal 216 using a division ratio that switches between two or more integer values in a controlled and repetitive fashion such that the average of the two or more integer values is a non-integer value, thereby effectively causing divider 244 to divide by a non-integer value. Divided clock signal 254 may be used for phase and/or frequency comparison with reference frequency 218 by phase/frequency detector 242.

Delta sigma modulator 252 may be configured to control the division ratio of divider 244 by generating and providing a pseudo random stream of numbers, which, when averaged, equals the desired fractional ratio N+f. Each number of the pseudo random sequence is provided at a respective rising edge of divided clock signal 254. The number of the pseudo random sequence received by divider 244 corresponds to the next division ratio to be used when dividing output oscillating signal 116. One of the practical consequences of the operations performed by delta-sigma modulator, as described above, is that quantization noise is introduced when generating the pseudo-random number sequence. This quantization noise may be one of many causes of the presence of fractional spur(s) in output oscillating signal 216. To mitigate such spurs, delta-sigma modulator 252 may be configured to shape this quantization noise such that the quantization noise is shifted to higher frequencies. By doing so, the quantization noise may be attenuated by loop filter 248. Although such a technique may result in a reduction of fractional spurs, some fractional spurs (e.g., in the lower frequencies closer to the output frequency of output oscillating signal 216) may still be present due to the quantization noise, along with other causes, such as, non-linear coupling of the Nth harmonic in $F_{REF}$ and $F_{VCO}$, coupling/leakage, etc.

In an ideal situation, if there are no fractional spurs, output oscillating signal 216 may be represented in accordance with Equation 3:

$$x_{lo}(t) = e^{j2\pi F_{VCO}t}, \quad \text{Equation 3}$$

where,
$x_{lo}(t)$=an ideal output oscillating signal,
e=the mathematical constant that is equal to the base of the natural logarithm (also known as Euler's number),
j=an imaginary unit, and
t=the sampling rate at which analog RF signal 212 is sampled.

However, because of the fractional spur(s) present in output oscillation signal 216, output oscillation signal 216, in actuality, is non-ideal and may be represented in accordance with Equation 4:

$$\hat{x}(t) = e^{j2\pi F_{VCO}t} + \alpha e^{j[2\pi(F_{VCO}+F_{SPUR})t+\delta]}, \quad \text{Equation 4}$$

$$= e^{j2\pi F_{VCO}t}(1 + \alpha e^{j[2\pi F_{SPUR}t+\delta]})$$

where,
$\hat{x}_{lo}(t)$=non-ideal output oscillating signal 216,
α=represents the level of attenuation of quantization noise performed by delta sigma modulator 252,
δ=the phase associated with the fractional spur present in output oscillating signal 216, and
$F_{SPUR}=F_{REF} \times f$.

As will be described below, processor 208, with the assistance of TDC 206, may be configured to construct an estimate of the fractional spur present in output oscillating signal 216 (i.e., $\alpha e^{j[2\pi(F_{VCO}+F_{SPUR})t+\delta]}$), and baseband integrated circuit 260 may be configured to use the estimate to remove the fractional spur. TDC 206 and processor 208 are described as follows.

TDC 206 may be configured to sample the instantaneous phase difference between reference frequency 218 and output oscillating signal 216 at a given sampling period. For example, in accordance with an embodiment, TDC 106 may be configured to determine a rising edge of output oscillating signal 216 and the first rising edge of reference frequency 218 that is subsequent to the determined rising edge of output oscillating signal 216. The instantaneous phase difference may then be determined by determining a difference between the determined rising edge of output oscillating signal 216 and the determined first rising edge of reference frequency 218 that is subsequent to the determined rising edge of output oscillating signal 216.

In accordance with another embodiment, TDC may be configured to determine a rising edge of reference frequency 218 and the first rising edge of output oscillating signal 216 that is subsequent to the determined rising edge of reference frequency 218. The instantaneous phase difference may then be determined by determining a difference between the determined rising edge of reference frequency 218 and the determined first rising edge of output oscillating signal 216 that is subsequent to the determined rising edge of reference frequency 218.

The determined phase difference may be received by processor 120 as a digitized, quantized sequence 220. Digitized, quantized sequence 220 may be a representation of the final phase of output oscillating signal 216 (i.e., the target output frequency of output oscillating signal 216 that is achieved when PLL 204 has achieved phase/frequency lock).

The final phase of output oscillating signal 216 represented by digitized, quantized sequence 120 may defined in accordance with Equation 5:

$$p(n) = p_m(n) + p_s(n) + p_v(n), \quad \text{Equation 5}$$

where,
- p(n)=the final phase of output oscillating signal 216,
- $P_m$(n)=the phase associated with the main nominal tone of output oscillating signal 216,
- $p_s$(n)=the phase associated with the fractional spur present in output oscillating signal 216, and
- $p_v$(n)=the residual zero-mean Gaussian phase noise.

Processor 208 may be a DSP that is configured to estimate an amplitude and a phase associated the undesired fractional spur (i.e., $p_m$(n)) based on digitized, quantized sequence 120. $p_m$(n) may be determined by subtracting out $p_s$(n) and $p_v$(n) from p(n). Using the estimated amplitude and the phase associated with the undesired fractional spur, processor 108 may construct an estimate 222 of the fractional spur, where estimate 222 is equal to $\alpha e^{j[2\pi(F_{VCO}+F_{SPUR})t+\delta]}$. Estimate 222 may be received by baseband integrated circuit 260 of communication circuit 202.

Baseband integrated circuit 260 may include timing alignment logic 238 and combination logic 240. Timing alignment logic 238 is configured to align the digital baseband signal received from RF integrated circuit 258 with estimate 222 such that any delays that are created via the RF integrated circuit 258 path and/or the VCO 216—TDC 206—processor 208 path are compensated for (e.g., canceled). In addition to, or in lieu of timing alignment logic 238, baseband integrated circuit 260 may include timing alignment 256, which may configured to align estimate 222 with the digital baseband signal received from RF integrated circuit 258 such that the delays described above are compensated for.

Combination logic 240 may be configured to compensate for a fractional spur based on estimate 222. For example, combination logic 240 may be configured to combine the digital baseband signal received from RF integrated circuit 258 with estimate 222 to provide a clean (i.e., spur-free) digital baseband signal 224. Clean digital baseband signal 224 is an example of second signal 124, as shown in FIG. 1.

In accordance with an embodiment, combination logic 240 may combine the digital baseband signal received from RF integrated circuit 258 with estimate 222 by multiplying the digital baseband signal by estimate 222 subtracted from one (i.e., $1 - \alpha e^{j[2\pi(F_{VCO}+F_{SPUR})t+\delta]}$) to provide clean digital baseband signal 224. In accordance with another embodiment, combination logic 240 may combine the digital baseband signal with estimate 222 by dividing the digital baseband signal by the estimate 222 added to one (i.e., $1+ \alpha e^{j[2\pi(F_{VCO}+F_{SPUR})t+\delta]}$) to provide clean digital baseband signal 224. Clean digital baseband signal 224 includes the digital baseband signal received from RF integrated circuit 258 with the fractional spur substantially removed.

The mitigation of the fractional spur becomes apparent in view of the Equations described below.

As described above with reference to Equation 4, non-ideal output oscillating signal 216 is equal to $\hat{x}_{lo}(t)$. The fractional spur(s) included in non-ideal output oscillating signal 216 may be introduced into analog RF signal 212 and may be subsequently passed to the digital baseband signal generated as a result of the down-converting process performed by RX mixer 230. For example, the output of RX mixer 230 may be defined in accordance with Equation 6:

$$\hat{y}(t) = x_r(t) \times \hat{x}_{lo}(t), \quad \text{Equation 6}$$
$$= x_r(t) \times (1 + \alpha e^{j[2\pi f_{spur}t+\delta]}) x_{lo}(t),$$

where,
- $\hat{y}(t)$=the output of RX mixer 230, and
- $x_r$(t)=analog RF signal 212 that has been amplified and low-noise filtered.

As is evident from Equation 6, the fractional spur included in $\hat{x}_{lo}(t)$ is introduced into analog RF signal 212 as a result of the down-converting process performed by RX mixer 230. The output of RX mixer 230, $\hat{y}(t)$, is then baseband filtered and converted into digital baseband signal, which includes the fractional spur.

In accordance with an embodiment, combination logic 240 may comprise a multiplier that is configured to apply (e.g., post-compensate) estimate 222 to the digital baseband signal by multiplying the digital baseband signal by estimate 222 subtracted from one to provide clean digital baseband signal 224, as shown below in accordance with Equation 7:

$$y_c(t) = \hat{y}(t)(1 - \alpha \alpha e^{j[2\pi(F_{VCO}+F_{SPUR})t+\delta]}), \quad \text{Equation 7}$$

where,
- $y_c$(t)=output of RX mixer 230 due to post-compensation (which is equivalent to clean digital baseband signal 224).

In accordance with another embodiment, combination logic 240 may comprise a divider that is configured to apply estimate 222 to the digital baseband signal by dividing the digital baseband signal by estimate 222 added to one, which is shown below in accordance with Equation 8:

$$y_c(t) = \frac{\hat{y}(t)}{(1 + \alpha e^{j[2\pi f_{spur}t+\delta]})}, \quad \text{Equation 8}$$

Equation 7 and Equation 8 can be simplified into Equation 9, which is shown below:

$$y_c(t) = x_r(t) \times x_{lo}(t), \quad \text{Equation 9}$$

As is evident from Equation 9, clean digital baseband signal 224 is equivalent to an output of RX mixer 230, where the output is based on ideal output oscillating signal 216, $x_{lo}(t)$. Accordingly, the fractional spur attributed to output oscillating signal 216 is removed from digital baseband signal provided by RF integrated circuit 248.

While the foregoing description describes that estimate 222 is applied to a digital version of baseband signal, it is noted that in accordance with particular embodiments, that an estimate of the undesired fractional spur may be applied to an analog version of baseband signal. For example, RF integrated circuit 258 may include combination logic that is configured to apply an estimate of the undesired fractional spur to the analog baseband signal provided by RX baseband filter 234.

Figure 3:
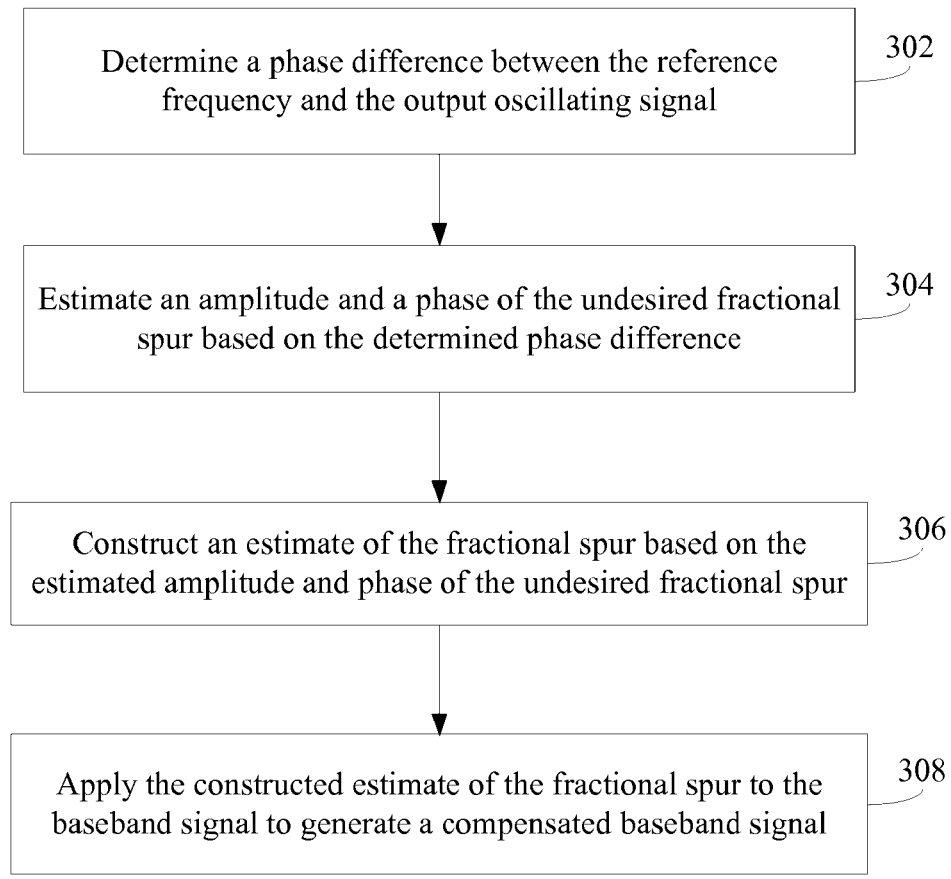
FIG. 3 shows a flowchart providing a process for compensating for an undesired fractional spur in a baseband signal, according to an embodiment.

Accordingly, in embodiments, communication system 200 may operate in various ways to compensate for undesired fractional spurs in a baseband signal. For example, FIG. 3 shows a flowchart 300 providing example steps for compensating for undesired fractional spurs in a digital baseband signal. Communication system 100 of FIG. 1 and communication system 200 of FIG. 2 may each operate according to flowchart 300. Other structural and operational embodiments will be apparent to persons skilled in the relevant art(s) based on the discussion regarding flowchart 300. Flowchart 300 is described as follows.

Flowchart 300 may begin with step 302. In step 302, a phase difference between a reference frequency and an output oscillating signal is determined. For example, as described above with respect to FIG. 2, TDC 206 may be configured to determine a phase difference between reference frequency 218 and output oscillating signal 216. In accordance with an embodiment, the determined phase difference may be provided as a quantized, digitized sequence 220. Additional details regarding the determination of the phase difference is described below with reference to FIG. 4.

In step 304, an amplitude and a phase of an undesired fractional spur is estimated based on the determined phase difference. For example, as described above with respect to FIG. 2, processor 208 may estimate the amplitude and the phase of the undesired fractional spur present in output oscillating signal 218 based on digitized, quantized sequence 120.

In step 306, an estimate of the fractional spur is constructed based on the estimated amplitude and phase of the undesired fractional spur. For example, as described above with respect to FIG. 2, processor 208 constructs estimate 222 based on the estimated amplitude and phase of the undesired fractional spur present in output oscillating signal 216.

In step 308, the constructed estimate of the fractional spur is applied to a baseband signal to generate a compensated baseband signal. For example, as described above with respect to FIG. 2, combination logic 240 applies estimate 222 to the digital baseband signal received from RF integrated circuit 258 to generate clean digital baseband signal 224.

In accordance with an embodiment, the combination logic may generate the compensated baseband signal by multiplying the baseband signal by the constructed estimate of the undesired fractional spur subtracted from one. For example, as described above with respect to FIG. 2, combination logic 250 may comprise a multiplier that is configured to multiply the digital baseband signal received from RF integrated circuit 258 by estimate 222 subtracted from one to generate clean digital baseband signal 224.

In accordance with another embodiment, the combination logic may generate the compensate baseband signal by dividing the baseband signal by the constructed estimate of the undesired fractional spur added to one. For example, as described above with respect to FIG. 2, combination logic 250 may comprise a divider that is configured to divide the digital baseband signal received from RF integrated circuit 258 by estimate 222 added to one to generate clean digital baseband signal 224.

Figure 4:
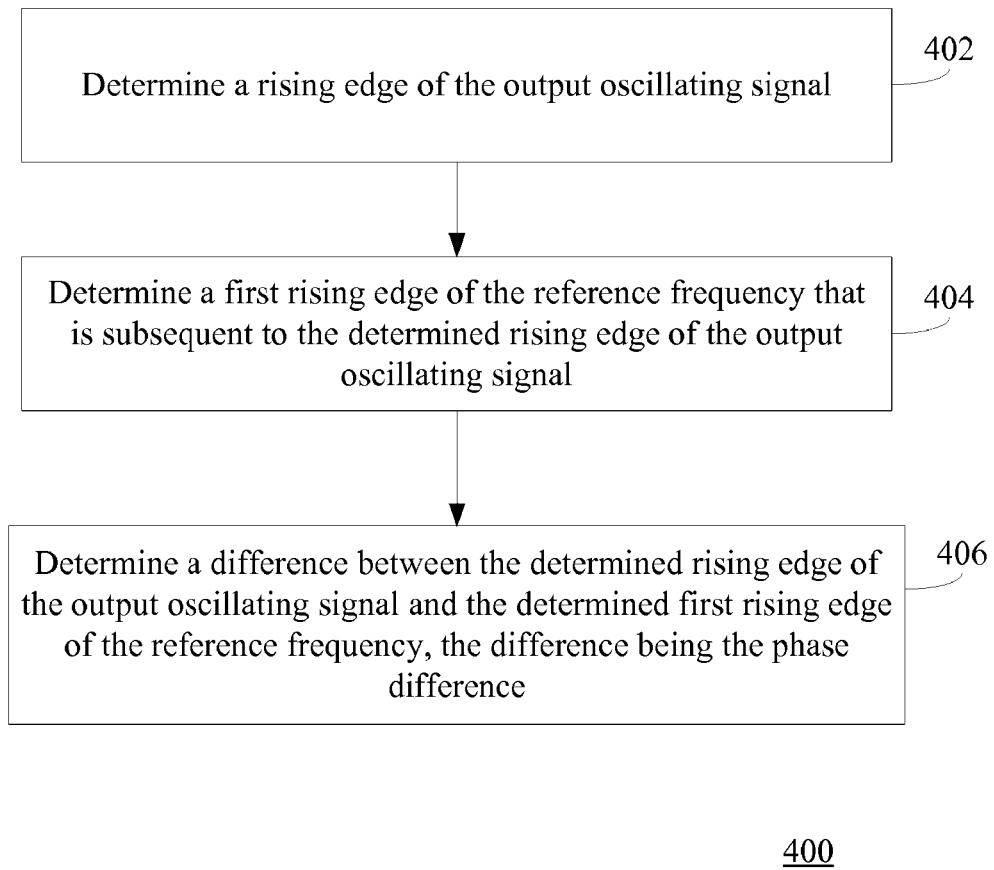
FIG. 4 shows a flowchart providing a process for determining a phase difference between an output oscillating signal and a reference frequency, according to an example embodiment.

FIG. 4 shows a flowchart 400 providing example steps for determining a phase difference between an output oscillating signal and a reference frequency. Communication system 100 of FIG. 1 and communication system 200 of FIG. 2 may each operate according to flowchart 400. Other structural and operational embodiments will be apparent to persons skilled in the relevant art(s) based on the discussion regarding flowchart 400. Flowchart 400 is described as follows.

Flowchart 400 may begin with step 402. In step 402, a rising edge of the output oscillating signal is determined. For example, as described above with respect to FIG. 2, TDC 206 may determine a rising edge of output oscillating signal 216.

In step 404, a first rising edge of the reference frequency that is subsequent to the determined rising edge of the output oscillating signal is determined. For example, as described above with respect to FIG. 2, TDC 206 may be configured to determine the first rising edge of reference frequency 218 that is subsequent to the determined rising edge of output oscillating signal 216.

In step 406, a difference between the determined rising edge of the output oscillating signal and the determined first rising edge of the reference frequency is determined, where the difference is the phase difference between the output oscillating signal and the reference frequency. For example, as described above with respect to FIG. 2, TDC 206 may be configured to determine the difference between the determined rising edge of output oscillating signal 216 and the determined first rising edge of reference frequency 218.

Example Transmitter Including a Time-to-Digital Converter (TDC)-Assisted Phase-Locked Loop (PLL)

Figure 5:
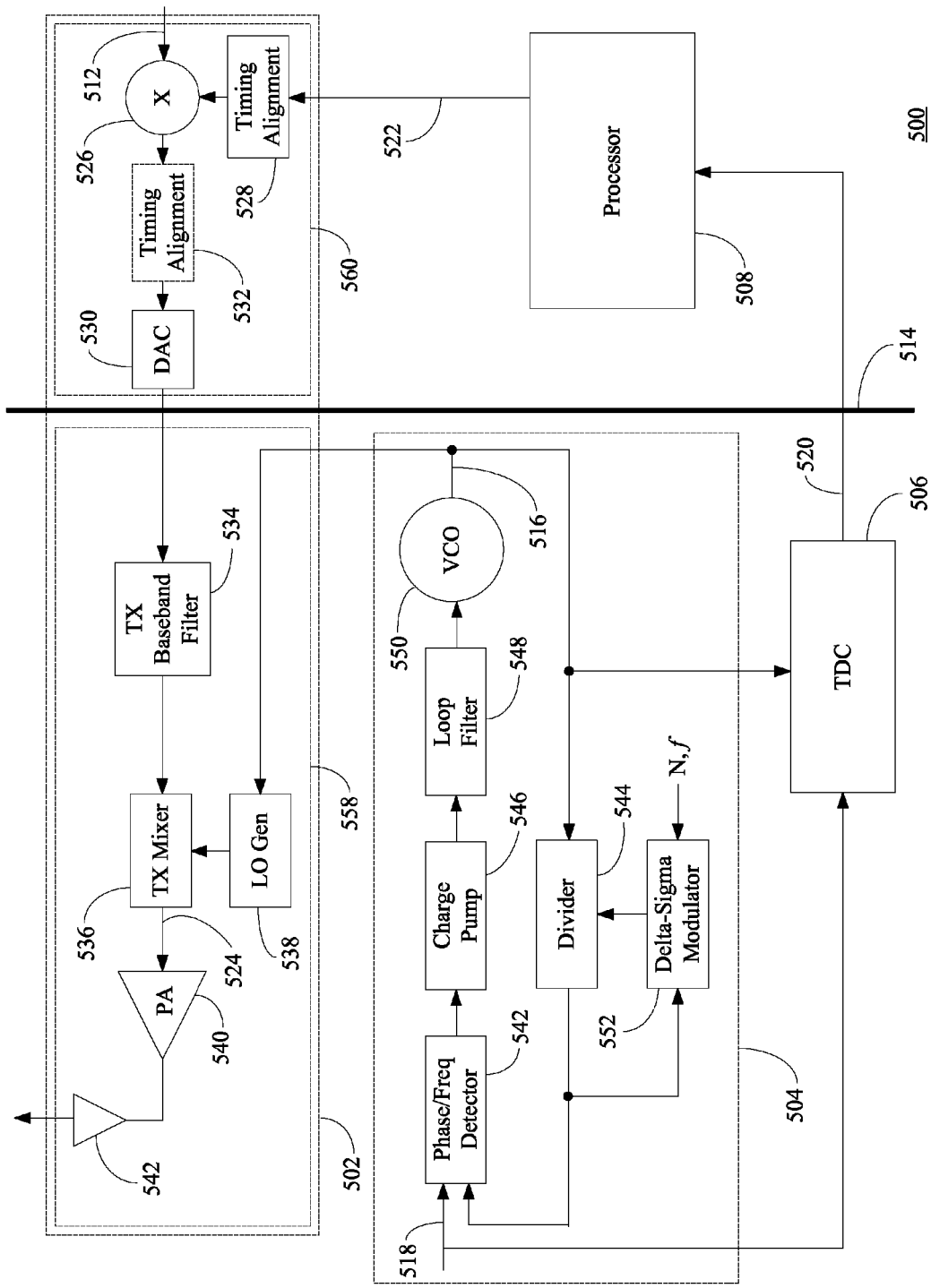
FIG. 5 depicts a block diagram of another example of the communication system of FIG. 1, according to an embodiment.

FIG. 5 depicts a block diagram of a communication system 500, according to an embodiment. Communication system 500 is an example of communication system 100. As shown in FIG. 5, communication system 500 includes a communication circuit 502, a PLL 504, a TDC 506, and a processor 508. Communication circuit 502 is an example of communication circuit 102, PLL 504 is an example of PLL 104, TDC 506 is an example of TDC 106, and processor 508 is an example of processor 108, as respectively shown in FIG. 1. In the embodiment depicted in FIG. 5, communication circuit 202 is configured as a transmitter.

Particular components of communication system 500 may be configured to operate in the analog domain, and other components of communication system 500 may be configured to operate in the digital domain. For example, components to the left of line 514 may be configured to operate in the analog domain, whereas components to the right of line 514 may be configured to operate in the digital domain. In other embodiments, other combinations of components may be digital or analog.

PLL 504, TDC 506, and processor 508 respectively operate in a similar fashion as PLL 204, TDC 206, and processor 208, as described above with respect to FIG. 2, and therefore, are not described in detail for sake of brevity. Briefly, TDC 506 may be configured to determine a phase difference between a reference frequency 518 and an output oscillating signal 516 that is provided by PLL 504. TDC 506 may provide the determined phase difference as a digitized, quantized sequence 520. Processor 502 may be configured to estimate an amplitude and a phase of an undesired fractional spur present in output oscillating signal 516 based on the determined estimate and construct an estimate 522 of the undesired fractional spur. Estimate 522 is received by communication circuit 502.

Communication circuit 502 may include one or more integrated circuits. For example, in accordance with an embodiment, communication circuit 502 includes a baseband integrated circuit 560 and an RF integrated circuit 558. Baseband integrated circuit 560 may be configured to receive a digital baseband signal 512. Digital baseband signal 512 is an example of first signal 112, as shown in FIG. 1. Baseband integrated circuit 560 may include timing alignment logic 528 and combination logic 526.

Timing alignment logic 528 may be configured to align estimate 522 to digital baseband signal 512 (e.g., by delaying estimate 522) before providing estimate 522 to combination logic 526 such that any delays that are created via the VCO 550-TDC 506-processor 508 path are compensated for.

Combination logic 526 may be configured to apply estimate 522 to digital baseband signal 512 to provide a pre-compensated (e.g., distorted) digital baseband signal. In accordance with an embodiment, combination logic 526 may apply estimate 522 to digital baseband signal 512 by multiplying digital baseband signal 512 by estimate 522 subtracted from one, as is shown below in Equation 10:

$$x_c(t) = x_d(t)(1 - \alpha e^{j[2\pi f_{spur}t + \delta]}),\qquad \text{Equation 10}$$

where,
- $x_c(t)$=the pre-compensated digital baseband signal
- $x_d(t)$=digital baseband signal 512

In accordance with another embodiment, combination logic 526 may be configured to apply estimate 522 to digital baseband signal 512 by dividing digital baseband signal 512 by estimate 522 added to one, as is shown below in Equation 11:

$$x_c(t) = \frac{x_d(t)}{(1 + \alpha e^{j[2\pi f_{spur}t + \delta]})},\qquad \text{Equation 11}$$

The pre-compensated digital baseband signal is received by DAC 530, which may be configured to convert the pre-compensated digital baseband signal to a pre-compensated analog baseband signal.

In lieu of timing alignment logic 528, baseband integrated circuit 560 may include timing alignment logic 532, which may be configured to adjust the pre-compensated digital baseband signal such that any delays that are created via the RF integrated circuit 558 path are compensated for.

RF integrated circuit 558 may be configured to convert the pre-compensated analog baseband signal received from baseband integrated circuit 560 into a clean (i.e., spur-free) analog RF signal 524 for transmission to a remote device. Clean analog RF signal 524 is an example of second signal 124, as shown in FIG. 1. RF integrated circuit 558 may include a transmit (TX) baseband filter 534, a TX mixer 536, LO gen 538, a power amplifier (PA) 540, and antenna(s) 542.

TX baseband filter 534 may be configured to receive the pre-compensated analog baseband signal from baseband integrated circuit 560 and limit the bandwidth of the pre-compensated analog baseband signal such that it is suitable for RF transmission and the pre-compensated analog baseband signal is received by TX mixer 536. TX mixer 536 may be configured to mix a LO frequency received from LO gen 538 and the pre-compensated analog baseband signal to up-convert the pre-compensated analog baseband signal to provide an RF signal. The LO frequency received from LO gen 538 may be generated based on output oscillating signal 516 provided by PLL 504.

As described above with respect to FIG. 2, output oscillating signal 516 may include undesired fractional spur(s). Conventionally, the fractional spur(s) are introduced into an analog baseband signal during the up-converting process performed by TX mixer 536. However, by providing a pre-compensated analog baseband signal to TX mixer 536, the fractional spur(s) attributed to output oscillating signal 516 are mitigated during the up-converting process. For example, the output of TX mixer 536 may be defined in accordance with Equation 12:

$$\hat{y}(t) = x_c(t) \times \hat{x}_{lo}(t),\qquad \text{Equation 12}$$

where,
- $\hat{y}(t)$=the output of TX mixer 536 based on non-ideal output oscillating signal ($\hat{x}_{lo}(t)$),
- $x_c(t)$=the pre-compensated analog baseband signal (e.g., from TX baseband filter 534 in the example of FIG. 5).

By synthesizing the pre-compensated analog baseband signal with non-ideal output oscillating signal 516, Equation 12 is simplified to Equation 13:

$$y(t) = x_d(t) \times x_{lo}(t),\qquad \text{Equation 13}$$

where,
- $y(t)$=the output of TX mixer 536 based on an ideal output osculating signal ($x_{lo}(t)$), and
- $x_d(t)$=an analog baseband signal with no undesired fractional spurs (i.e., an ideal analog baseband signal).

As is evident from Equation 13, when synthesizing non-ideal output oscillating signal 516 with a pre-compensated analog baseband signal, the output of TX mixer 536 is equivalent to synthesizing an ideal output oscillating signal with an ideal analog baseband signal, thereby resulting in clean analog RF signal 524.

Clean analog RF signal 524 is amplified by PA 540 and subsequently received by antenna(s) 542 for transmission to a remote device.

While the foregoing description describes that estimate 522 is applied to a digital version of baseband signal, it is noted that in accordance with particular embodiments, that an estimate of the undesired fractional spur may be applied to an analog version of baseband signal. For example, RF integrated circuit 5587 may include combination logic that is configured to apply an estimate of the undesired fractional spur to the analog baseband signal provided by TX baseband filter 534.

Figure 6:
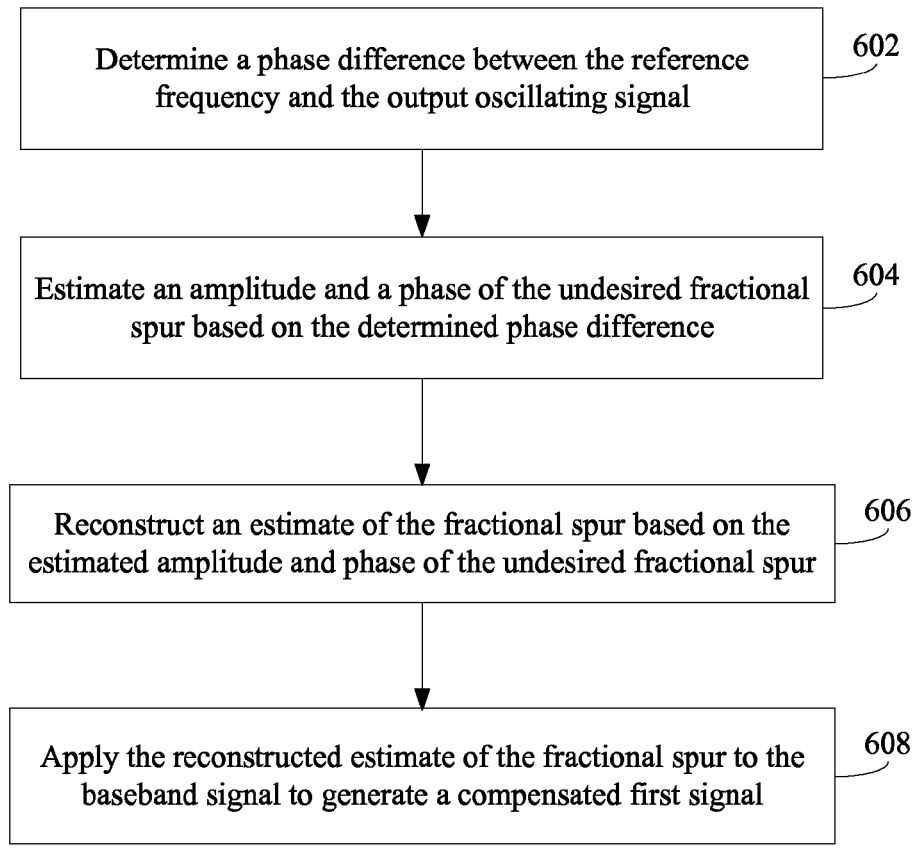
FIG. 6 shows a flowchart providing a process for compensating for an undesired fractional spur in a first signal, according to an embodiment.

Accordingly, in embodiments, communication system 500 may operate in various ways to compensate for undesired fractional spurs in a first signal. For example, FIG. 6 shows a flowchart 600 providing example steps for compensating for undesired fractional spurs in a first signal. Communication system 100 of FIG. 1 and communication system 500 of FIG. 5 may each operate according to flowchart 600. Other structural and operational embodiments will be apparent to persons skilled in the relevant art(s) based on the discussion regarding flowchart 600. Flowchart 600 is described as follows.

Flowchart 600 may begin with step 602. In step 602, a phase difference between a reference frequency and an output oscillating signal is determined. For example, as described above with respect to FIG. 5, TDC 506 may be configured to determine a phase difference between reference frequency 518 and output oscillating signal 516. In accordance with an embodiment, the determined phase difference may be provided as a quantized, digitized sequence 520.

In step 604, an amplitude and a phase of an undesired fractional spur is estimated based on the determined phase difference. For example, as described above with respect to FIG. 5, processor 508 may estimate the amplitude and the phase of the undesired fractional spur present in output oscillating signal 518 based on digitized, quantized sequence 520.

In step 604, an estimate of the fractional spur is constructed based on the estimated amplitude and phase of the undesired fractional spur. For example, as described above with respect to FIG. 5, processor 508 constructs estimate 522 based on the estimated amplitude and phase of the undesired fractional spur present in output oscillating signal 516.

In step 608, the constructed estimate of the fractional spur is applied to a baseband signal to generate a compensated first signal. For example, as described above with respect to FIG. 2, combination logic 526 applies estimate 522 to digital baseband signal 512 to generate a compensated first signal (i.e., clean analog RF signal 524).

Figure 7:
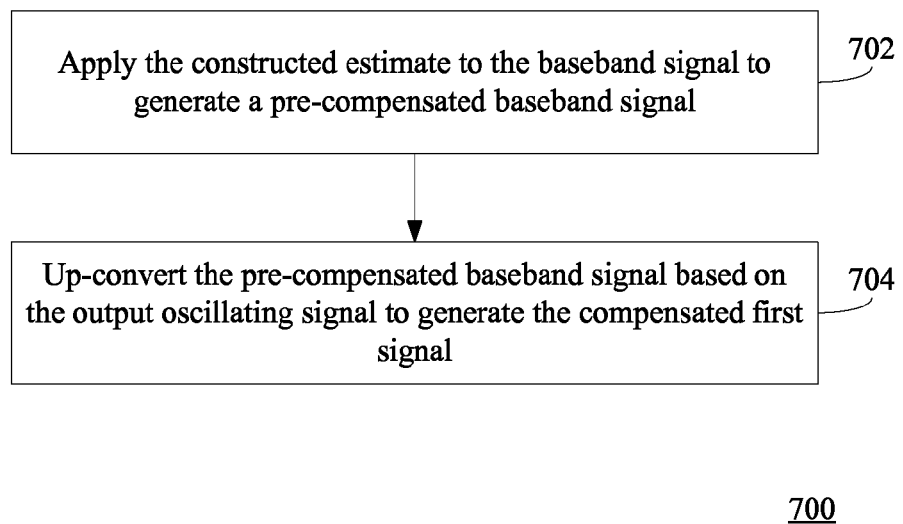
FIG. 7 shows a flowchart providing example steps for applying a constructed estimate of an undesired fractional spur to a baseband signal and generating a compensated first signal, according to an example embodiment.

FIG. 7 shows a flowchart 700 providing example steps for applying the constructed estimate of the fractional spur to a baseband signal and generating the compensated first signal. Communication system 100 of FIG. 1 and communication system 200 of FIG. 2 may each operate according to flowchart 700. Other structural and operational embodiments will be apparent to persons skilled in the relevant art(s) based on the discussion regarding flowchart 700. Flowchart 700 is described as follows.

In step 702, the constructed estimate of the baseband signal is applied to the baseband signal to generate a pre-compensated (e.g., distorted) baseband signal. For example, as described above with respect to FIG. 5, combination logic 526 applies estimate 522 to digital baseband signal 512 to generate the pre-compensated baseband signal, which is received by RF integrated circuit 558 (e.g., after being converted to analog form by DAC 530).

In accordance with an embodiment, the combination logic applies the estimate to the baseband signal by multiplying the baseband signal by the constructed estimate of the undesired fractional spur subtracted from one to generate the pre-compensated baseband signal. For example, as described above with respect to FIG. 5, combination logic 526 may comprise a multiplier that is configured to apply estimate 522 to digital baseband signal 512 by multiplying digital baseband signal 512 by estimate 522 subtracted from one to generate the pre-compensated digital baseband signal.

In step 704, the pre-compensated baseband signal is up-converted based on the output oscillating signal to generate the compensated first signal. For example, as described above with respect to FIG. 5, TX mixer 536 up-converts the pre-compensated analog baseband signal received from TX baseband filter 534 based on output oscillating signal 516 to generate clean analog RF signal 524, thereby canceling out the undesired fractional spur.

In accordance with an embodiment, TX mixer 536 may up-convert the pre-compensated analog baseband signal by synthesizing an LO frequency received from LO gen 538 (which is based on output oscillating signal 516) and the pre-compensated analog baseband signal.

Example Processor Implementation

Figure 8:
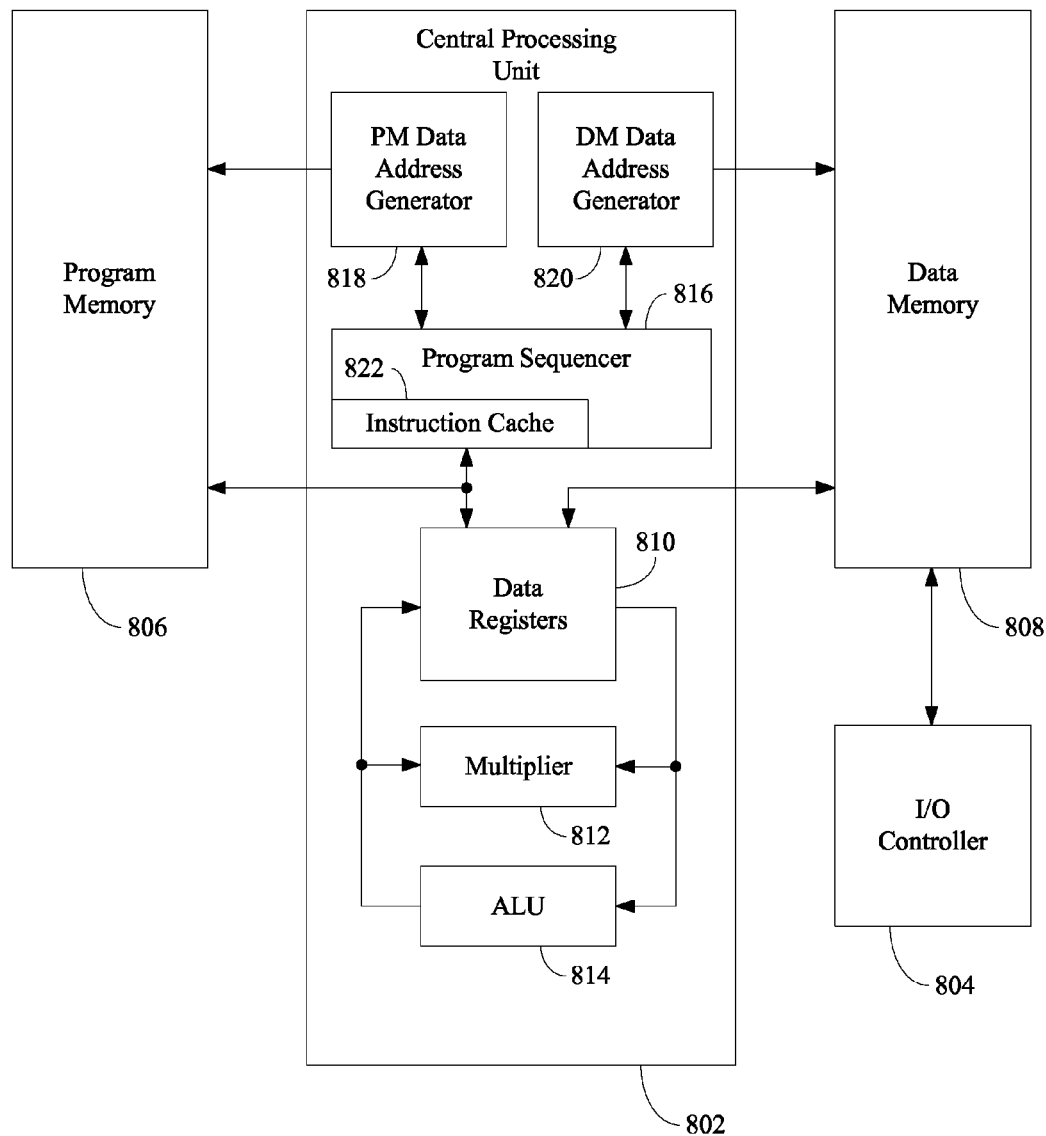
FIG. 8 depicts a block diagram of a processor that may be implemented in a communication system and configured to mitigate undesired fractional spurs in communication signals, according to an embodiment.

FIG. 8 depicts a block diagram of a processor 800 in which processor 108, processor 208, and processor 508, as respectively shown in FIGS. 1, 2, and 5, may be implemented. Processor 800 may include central processing unit (CPU) 802, an I/O controller 804, a program memory 806, and a data memory 808. CPU 802 may be configured to perform the main computation and data processing function of processor 800. I/O controller 804 may be configured to control communication to external devices via one or more serial ports and one or more link ports. For example, I/O controller 805 may be configured to provide data read from data memory 808 to external devices and/or store data received from external device into data memory 808. Program memory 806 may be configured to store program instructions used to process data. Data memory 808 may be configured to store the data to be processed.

Processor 800 further includes one or more data registers 810, a multiplier 812, and/or an arithmetic logic unit (ALU) 814. Data register(s) 810 may be configured to store data for intermediate calculations, prepare data to be processed by CPU 802, serve as a buffer for data transfer, hold flags for program control, etc. Multiplier 812 may be configured to receive data stored in data register(s) 810, multiply the data, and store the result into data register(s) 810 and/or data memory 808. ALU 814 may be configured to perform addition, subtraction, absolute value operations, logical operations (AND, OR, XOR, NOT, etc.), shifting operations, conversion between fixed and floating point formats, and/or the like.

CPU 802 further includes a program sequencer 816, a program memory (PM) data address generator 818, a data memory (DM) data address generator 820. Program sequencer 816 may be configured to manage program structure and program flow by generating an address of an instruction to be fetched from program memory 806. Program sequencer 816 may also be configured to fetch instruction(s) from instruction cache 822, which stores an N number of recently-executed instructions, where N is a positive integer. PM data address generator 818 may be configured to supply addresses to program memory 806, which specify where the data is to be read form or written to in program memory 806. DM data address generator 820 may be configured to supply addresses to data memory 808, which specify where the data is to be read from or written to in data memory 808.

Further Example Embodiments

Communication systems may include various types of devices that include transmitters, receivers, and transceivers to communicate data between a variety of devices. Embodiments described herein may be included in receivers, transmitters, and transceivers of such devices. For instance, embodiments may be included in mobile devices (laptop computers, handheld devices such as mobile phones (e.g., cellular and smart phones), handheld computers, handheld music players, and further types of mobile devices), desktop computers and servers, computer networks, and telecommunication networks.

Embodiments can be incorporated into various types of communication systems, such as intra-computer data transmission structures (e.g., Peripheral Component Interconnect (PCI) Express bus), telecommunication networks, traditional and wireless local area networks (LANs and WLANs), wired and wireless point-to-point connections, optical data transmission systems (e.g., short haul, long haul, etc.), high-speed data transmission systems, coherent optical systems and/or other types of communication systems using transceivers.

Techniques, including methods, described herein may be implemented by hardware (digital and/or analog) or a combination of hardware with software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable storage media. Examples of such computer-readable storage media include, but are not limited to, a hard disk, a removable magnetic disk, a removable optical disk, flash memory cards, digital video disks, random access memories (RAMs), read only memories (ROM), and the like. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable storage media may, for example, store computer program logic, e.g., program modules, comprising computer executable instructions that, when executed, provide and/or maintain one or more aspects of functionality described herein with reference to the figures, as well as any and all components, steps and functions therein and/or further embodiments described herein.

Such computer-readable storage media are distinguished from and non-overlapping with communication media (do not include communication media). Communication media typically embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as signals transmitted over wires. Embodiments are also directed to such communication media.

Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A circuit that compensates for an undesired fractional spur in a baseband signal due to a fractional phase lock loop (PLL), the circuit comprising:
   a time-to-digital converter (TDC) configured to determine a phase difference between a reference frequency received by the fractional PLL and an output oscillating signal generated by the fractional PLL, the output oscillating signal including an output frequency and the undesired fractional spur, the output oscillating signal used to convert a first signal to the baseband signal;
   a digital signal processor (DSP) configured to estimate an amplitude and a phase of the undesired fractional spur based on the determined phase difference, and to construct an estimate of the fractional spur; and
   combination logic configured to apply the constructed estimate of the fractional spur to the baseband signal to generate a compensated baseband signal.

2. The circuit of claim 1, wherein the combination logic comprises a multiplier configured to multiply the baseband signal by the constructed estimate of the fractional spur subtracted from one to generate the compensated baseband signal.

3. The circuit of claim 1, wherein the combination logic comprises a divider configured to divide the baseband signal by the constructed estimate of the fractional spur added to one to generate the compensated baseband signal.

4. The circuit of claim 1, wherein the fractional PLL is an analog fractional PLL and the TDC is an analog TDC.

5. The circuit of claim 1, where the TDC comprises:
   first logic configured to determine a rising edge of the output oscillating signal;
   second logic configured to determine a first rising edge of the reference frequency that is subsequent to the determined rising edge of the output oscillating signal; and
   third logic configured to determine a difference between the determined rising edge of the output oscillating signal and the determined first rising edge of the reference frequency, the difference being the phase difference.

6. The circuit of claim 1, wherein the constructed estimate of the fractional spur is applied to an analog version of the baseband signal.

7. The circuit of claim 1, wherein the constructed estimate of the fractional spur is applied to a digital version of the baseband signal.

8. A method for compensating for an undesired fractional spur in a baseband signal due to a fractional phase lock loop (PLL), the method comprising:
   determining a phase difference between a reference frequency received by the fractional PLL and an output oscillating signal generated by the fractional PLL, wherein the output oscillating signal includes an output frequency and the undesired fraction spur, and the output oscillating signal is used to convert a first signal to the baseband signal;
   estimating an amplitude and a phase of the undesired fractional spur based on the determined phase difference;
   constructing an estimate of the fractional spur based on the estimated amplitude and phase of the undesired fractional spur;
   applying the constructed estimate of the fractional spur to the baseband signal to generate a compensated baseband signal.

9. The method of claim 8, wherein said applying comprises:
   multiplying the baseband signal by the constructed estimate of the fractional spur subtracted from one to generate the compensated baseband signal.

10. The method of claim 8, further comprising:
    dividing the baseband signal by the constructed estimate of the fractional spur added to one to generate the compensated baseband signal.

11. The method of claim 8, wherein the fractional PLL is an analog fractional PLL.

12. The circuit of claim 8, where determining the phase difference between the reference frequency and the output oscillating signal comprises:
    determining a rising edge of the output oscillating signal;
    determining a first rising edge of the reference frequency that is subsequent to the determined rising edge of the output oscillating signal; and
    determining a difference between the determined rising edge of the output oscillating signal and the determined first rising edge of the reference frequency, the difference being the phase difference.

13. The circuit of claim 8, wherein applying the constructed estimate of the fractional spur to the baseband signal to generate a compensated baseband signal comprises applying the constructed estimate of the fractional spur to an analog version of the baseband signal.

14. The circuit of claim 8, wherein applying the constructed estimate of the fractional spur to the baseband signal to generate a compensated baseband signal comprises applying the constructed estimate of the fractional spur to a digital version of the baseband signal.

15. A circuit that compensates for an undesired fractional spur in a first signal due to a fractional phase lock loop (PLL), the circuit comprising:
    a time-to-digital converter (TDC) configured to determine a phase difference between a reference frequency received by the fractional PLL and an output oscillating signal generated by the fractional PLL, the output oscillating signal including an output frequency and the undesired fractional spur, the output oscillating signal used to convert a baseband signal to the first signal;
    a digital signal processor (DSP) configured to estimate an amplitude and a phase of the undesired fractional spur based on the determined phase difference, and to construct an estimate of the fractional spur; and combination logic configured to apply the constructed estimate of the fractional spur to the baseband signal to generate a compensated first signal.

16. The circuit of claim 15, further comprising:

second combination logic configured to apply the constructed estimate to the baseband signal to generate a pre-compensated baseband signal; and mixer logic configured to up-convert the pre-compensated baseband signal based on the output oscillating signal to generate the compensated first signal.

17. The circuit of claim 15, wherein the fractional PLL is an analog fractional PLL and the TDC is an analog TDC.

18. The circuit of claim 15, where the TDC comprises:

first logic configured to determine a rising edge of the output oscillating signal;

second logic configured to determine a first rising edge of the reference frequency that is subsequent to the determined rising edge of the output oscillating signal; and third logic configured to determine a difference between the determined rising edge of the output oscillating signal and the determined first rising edge of the reference frequency, the difference being the phase difference.

19. The circuit of claim 15, wherein the constructed estimate of the fractional spur is applied to an analog version of the baseband signal.

20. The circuit of claim 15, wherein the constructed estimate of the fractional spur is applied to a digital version of the baseband signal.

\* \* \* \* \*

UNITED STATES PATENT AND TRADEMARK OFFICE
CERTIFICATE OF CORRECTION

PATENT NO. : 9,041,444 B1
APPLICATION NO. : 14/109498
DATED : May 26, 2015
INVENTOR(S) : Alireza Tarighat Mehrabani et al.

Page 1 of 1

It is certified that error appears in the above-identified patent and that said Letters Patent is hereby corrected as shown below:

Claims

In column 18, line 33, in claim 12, delete "circuit" and insert -- method --, therefor.

In column 18, line 44, in claim 13, delete "circuit" and insert -- method --, therefor.

In column 18, line 49, in claim 14, delete "circuit" and insert -- method --, therefor.

Signed and Sealed this
Third Day of November, 2015

Michelle K. Lee
*Director of the United States Patent and Trademark Office*